United States Patent [19]
Bao

[11] Patent Number: 5,969,376
[45] Date of Patent: *Oct. 19, 1999

[54] ORGANIC THIN FILM TRANSISTOR HAVING A PHTHALOCYANINE SEMICONDUCTOR LAYER

[75] Inventor: Zhenan Bao, North Plainfield, N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/702,073

[22] Filed: Aug. 23, 1996

[51] Int. Cl.$^6$ .............................. H01L 35/24; H01L 51/00
[52] U.S. Cl. ................... 257/40; 257/66; 257/75; 438/99
[58] Field of Search ............................. 257/40, 66, 75; 438/99

[56] References Cited

U.S. PATENT DOCUMENTS

| | | | |
|---|---|---|---|
| 4,971,977 | 11/1990 | Turano | 514/307 |
| 5,039,561 | 8/1991 | Debe | 427/255.6 |
| 5,280,183 | 1/1994 | Batzel et al. | 257/40 |
| 5,294,820 | 3/1994 | Gemma et al. | 257/324 |
| 5,546,889 | 8/1996 | Wakita et al. | 117/84 |
| 5,629,530 | 5/1997 | Brown et al. | 257/40 |
| 5,705,826 | 1/1998 | Aratani et al. | 257/40 |

FOREIGN PATENT DOCUMENTS 2 627 629   2/1988   France ..................... H01L 29/78

OTHER PUBLICATIONS

Hirabaru et al., "Thermal Behavior of Thin Copper–Phtalocyanin Films," Vacuum (Japan) 22(7) 273, 1–5, Jan. 24, 1979.

Guillaud et al., Transient Properties of Nickel Phthalocyanine Thin Film Transistors, Chemical Physics Letters 219, pp. 123–126, Mar. 4, 1994.

Koezuka et al., Polythiophene Field–Effect Transistor with Polypyrrole Worked as Source and Drain Electrodes, Applied Physics Letters, vol. 62, pp. 1794–1796, Apr. 12, 1993.

Komiyama et al., Preparation of Highly Ordered Ultrathin Films of Copper(II) Phthalocyanine on Amorphous Substrates by Molecular Beam Depositiion, Jan. 28, 1997.

"Organic Field–Effect Transistors with High Mobility Based on Copper Phthalocyanine", by Bao, Z. et al., *Appl. Phys. Lett.*, 69(20), pp. 3066–3068 (Nov. 11, 1996).

"The Operation and Characteristics of Diphthalocyanine Field–Effect Transistors", by Clarisse, C. et al., *J. Appl. Phys.*, 69(5), pp. 3324–3327 (Mar. 1, 1991).

"Transient Behaviour of Thin Film Transistors Based on Nickel Phthalocyanine", by Guillard, G., *Thin Solid Films*, vol. 258, pp. 279–282 (Mar. 15, 1995).

"Effect of Crystalinity on Electrical Conductivity of a Cu–Phthalocyanine Film", by Masui, M. et al., *Trans. of the Inst. of Electrical Engineers of Japan*, Part A, vol. 112–A, No. 5, pp. 371–374 (May 1992).

(List continued on next page.)

*Primary Examiner*—Mahshid Saadat
*Assistant Examiner*—Allan R. Wilson
*Attorney, Agent, or Firm*—Richard J. Botos

[57] ABSTRACT

Thin film transistors in which the active layer is an ordered film of a pthalocyanine coordination compound with a field-effect mobility greater than $10^{-3}$ cm$^2$/Vs and a conductivity in the range of about $10^{-9}$ S/cm to about $10^{-7}$ S/cm at 20° C. are disclosed. Examples of suitable pthalocyanines include copper pthalocyanine, zinc pthalocyanine, hydrogen pthalocyanine, and tin pthalocyanine. Thin film devices made of these materials have an on/off ratio of at least about $10^4$. It is advantageous if the device is fabricated using a process in which the substrate is heated to a temperature in the range of about 30° C. to about 200° C. when the film is formed thereon.

4 Claims, 1 Drawing Sheet

OTHER PUBLICATIONS

"Preparation of Highly Ordered Ultrathin Films of Copper (11) Phthalocyanine on Amorphous Substrates by Molecular Beam Deposition," by Komiyama, M. et al. *Thin Solid Films,* 151, pp. 1.109–1.110 (1987).

"Organic–Thin–Film–Induced Molecular Epitaxy From the Vapor Phase", by Debe, M. K., *Thin Solid Films,* 197, pp. 336–347 (1991).

"Transport Properties of Nickel Phthalocyanine Thin Films Using Gold Electrodes," by Abdel–Malik, T. G. et al., *Thin Solid Films,* 256, 139–142 (1995).

"The First Field Effect Transistor Based on an Intrinsic Molecular Semiconductor," by Madru, M. et al., *Chemical Physics Letters,* vol. 42, No. 1.2, pp. 103–105 (Dec. 4, 1987).

"Transient Properties of Nickel Phthalocyanine Thin Film Transistors", by Guillard, G. et al., *Chemical Physics Letters,* 219, pp. 12–126 (Mar. 4, 1994).

"Field–Effect Transistor with Polythiophene Thin Films," by Koezuka, H. et al., *Synthetic Metals,* 18, pp. 699–705 (1987).

"A Universal Relation Between Conductivity and Field–Effect Mobility in Doped Amorphous Organic Semiconductors", by Brown, A. R. et al., *Synthetic Metals,* 68, pp. 65–70 (1994).

"Macromolecular Electronic Device: Field–Effect Transistor with a Polythiophene Thin Film, " by Tsumura, A. et al., *Applied Physics Letters,* 49(18), pp. 1210–1212 (Nov. 1986).

"Field–Effect Transistors Based on Intrinsic Molecular Semiconductors", by Guillaud, G., et al., *Chemical Physics Letters,* vol. 167, 6, pp. 503–506 (Apr. 1990).

"Polythiophene Field–Effect Transistor with Polypyrrole Worked as Source and Drain Electrodes," by Koezuka, H. et al., *Applied Physics Letters,* 62 (15), pp. 1794–1796 (Apr. 1993).

"Thin–Film Transistors Based on Nickel Phthalocyanine", by Guillard, G. et al., *Journal of Applied Physics,* 66, (9), pp. 4554–4556 (Nov. 1989).

ORGANIC THIN FILM TRANSISTOR HAVING A PHTHALOCYANINE SEMICONDUCTOR LAYER

FIELD OF THE INVENTION

This invention relates to thin film transistors (TFTs) that contain an active layer of organic material, and to methods for making such transistors.

BACKGROUND OF THE INVENTION

Organic semiconductor materials are currently being investigated for use as the active layer in a variety of devices including light-emitting diodes, nonlinear optical devices, and TFTs such as metal-insulator-semiconductor field effect transistors (MIS-FETs). Organic semiconductor materials offer processing advantages such as compatibility with flexible plastic substrates and ease of application by spin-coating and their use in processes for device fabrication is therefore attractive. However, in order for these materials to be useful for use in TFT devices, the resulting devices must have an on/off ratio (of the source/drain current) suited for the particular application. Although devices with on/off ratios as low a 100 are suited for some application, typically TFT devices must have an on/off ratio of at least about $10^3$. The properties of the organic semiconductor materials that govern the on/off ratio are carrier mobility and conductivity. Organic semiconductor materials typically have a carrier mobility in excess of about $10^{-8}$ cm$^2$/Vs but less than 1 cm$^2$/Vs. Consequently, based upon the relationship between carrier mobility, material conductivity, and device on/off ratio, the requisite conductivity of the organic semiconductor material is defined by the carrier mobility of the material and the desired on/off ratio.

A class of doped amorphous organic semiconductors is described in Brown, A. R., et al., "A universal relation between conductivity and field-effect mobility in doped amorphous organic semiconductors," *Synthetic Materials*, Vol. 68, pp. 65–70 (1994). Brown et al. report a linear relationship between the conductivity and the field effect mobility of such material, i.e., as the conductivity increases so does the field-effect mobility. Although Brown et al. report materials with a very high mobility, this high mobility was achieved at the expense of conductivity. Brown et al. conclude that high on/off ratios and high mobilities are not to be expected in devices constructed from amorphous organic semiconductors. Accordingly, if satisfactory devices are to be made from these materials, the field effect mobility and the conductivity of these materials must be within a range that provides a device with an on/off ratio of at least $10^5$.

SUMMARY OF THE INVENTION

The present invention is directed to a semiconductor TFT device in which the active layer is an organic semiconductor material with a field effect mobility greater than $10^{-3}$ cm$^2$/V-s and a conductivity in the range of about $10^{-9}$ S/cm to about $10^{-7}$ S/cm. These organic semiconductor materials are coordination compounds of phthalocyanine (referred to herein with the abbreviation Pc) with copper, zinc, tin, or hydrogen. These coordination compounds form ordered films, and exhibit higher field effect mobility at lower conductivities than amorphous, doped phthalocyanine. The present invention is also directed to a process for making these devices.

In one embodiment of the present invention, the device is a MIS-FET type TFT with an active layer of the organic semiconductor. Such devices typically have three spaced-apart contacts (e.g. conductive metals such as gold), at least two of which are in physical contact with the semiconductor layer. The third contact is adapted to control the current through the semiconductor layer between the first and second contacts.

The TFT device of the present invention is formed on a conventional substrate material such as glass, silicon or plastic. A layer of dielectric material is formed over the substrate. One of the contacts is physically connected to the substrate and the layer of dielectric material is interposed between the other two contacts and the substrate.

In the process of the present invention, the layer of phthalocyanine coordination compound is formed on a heated substrate. The temperature of the substrate is in the range of about 30° C. to about 200° C. It is advantageous if the temperature of the substrate is about 125° C. to about 175° C.

DETAILED DESCRIPTION

Figure 1:
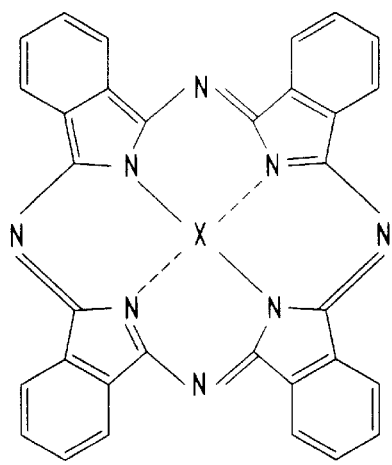
FIG. 1 is an illustration of the structure of the pthalocyanine coordination compounds of the present invention wherein the ion in the phthalocyanine is indicated generally by the letter X.

The present invention is directed to a TFT device in which the active layer is a phthalocyanine coordination compound and a process for making the device. The device of the present invention has an on/off ratio greater than $10^4$ at 20° C. In order to obtain devices with the desired on/off ratio, it is advantageous if the phtalocyanine has a field effect mobility greater than $10^{-3}$ cm$^2$/V-s and a conductivity in the range of about $10^{-9}$ S/cm to about $10^{-7}$ S/cm. FIG. 1 is an illustration of a phthalocyanine coordination compound. The coordinate ion is indicated generally by the letter X. It is advantageous if the coordinate ion is either copper, zinc, tin, or hydrogen.

Figure 2:
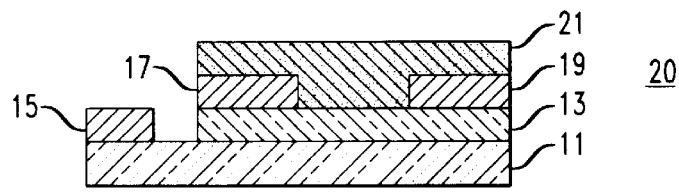
FIG. 2 is a cut away side view of a TFT device of the present invention.

FIG. 2 illustrates a MIS-FET type device according to the invention. The transistor 20 is a substrate 11 over which a layer of dielectric material 13 and a metal contact 15 are formed. Two additional metal contacts, 17 and 19, are formed over the dielectric layer 13. A layer of the phthalocyanine coordination compound 21 is formed over and between the contacts 17 and 19.

The substrate of the above-described device is made of conventional materials such as silicon, glass, or plastic. The contacts are made of a conventional material for this purpose such as gold. The dielectric material is a conventional material such as silicon dioxide, silicon nitride (Si$_3$N$_4$), or aluminum oxide (Al$_2$O$_3$). The contacts and the dielectric layer are formed on the substrate using well known, conventional techniques which are not discussed in detail herein.

By way of example, MIS-FET type TFTs are formed with a 12 µm channel length and a 250 µm gate length on an n-doped silicon substrate. A 3000 Å thick layer of silicon dioxide is formed over the substrate. The silicon dioxide layer functions as a gate dielectric material and has a capacitance of about 10 nF/cm$^2$. Two separate gold contacts are formed over the gate dielectric layer. A film of a pthalocyanine coordination compound is formed over the gate dielectric layer and the contacts formed thereon. The phthalocyanine film is formed on a heated substrate. The temperature of the substrate is in the range of about 30° to about 200° C. It is advantageous if the substrate temperature is about 125° C. to about 175° C.

The phthalocyanine film is formed on the substrate using conventional techniques such as vacuum deposition. It is advantageous if the thickness of the phthalocyanine film is about 500 Å to about 600 Å. TFTs so formed have an on/off ratio greater than $10^4$ at 20° C.

EXAMPLE

Phthalocyanine coordination compounds with platinum (Pt), copper (Cu), zinc (Zn), nickel (Ni), iron (Fe), tin (Sn), and hydrogen ($H_2$) were obtained from a commercial supplier. For convenience, the phthalocyanine coordination compound is referred to generally as X-Pc, where X is a generic designation for the coordination ion (e.g., Pt, Fe, H2, etc.) These materials were then purified by sublimation at a pressure of less than about $8 \times 10^{-4}$ Torr and a temperature of about 380° C. This sublimation procedure was performed three times total.

Devices were formed using the above identified phthalocyanine coordination compounds as the active layer. A layer of phthalocyanine coordination compound 21 was formed on a substrate to form the device 20 depicted in FIG. 2 and described generally above. In the context of this example, the term substrate is used to refer to the structure of a silicon substrate 11 on which is formed a layer of gate dielectric 13 with two contacts 17 and 19 formed thereon. A third contact 15 is formed directly on the silicon substrate.

The temperature of the substrate was controlled during the deposition of each film thereon to determine the effect of substrate temperature on the mobility and conductivity of the phthayanine layer. Individual films of each of the above-identified phthalocyanines coordination compounds were formed on substrates heated to temperatures of 30° C., 125° C., and 200° C. Each film was formed using vacuum deposition in an evaporation chamber at a pressure of $2 \times 10^{-6}$ torr. About 50 mg of the phthalocyanine was placed in a tungsten boat. The boat was placed in a conventional evaporator system. The substrate was also placed in the evaporator on a copper block. A temperature controller was used to control the temperature of the copper block which, in turn, was used to control the temperature of the substrate. The boat was heated to a temperature of about 380° C. and the phthalocyanine film was formed at a rate of about 4 Å to about 5 Å per second.

The field-effect mobility and the conductivity of the various films prepared as described above is enumerated in Table I below. The effect of the substrate temperature during film formation on the field-effect mobility and conductivity of the films is also reported in Table I.

TABLE I

| Material | Property | Substrate Temperature | | |
|---|---|---|---|---|
| | | 30° C. | 125° C. | 200° C. |
| Cu—Pc | Mobility (cm$^2$/Vs) | $6.0 \times 10^{-4}$ | $2 \times 10^{-2}$ | $6.7 \times 10^{-3}$ |
| | Conductivity (S/cm) | $1.8 \times 10^{-9}$ | $4 \times 10^{-9}$ | $3.1 \times 10^{-9}$ |
| | on/off ratio | $3.7 \times 10^4$ | $4 \times 10^5$ | $1.7 \times 10^5$ |

TABLE I-continued

| Material | Property | Substrate Temperature | | |
|---|---|---|---|---|
| | | 30° C. | 125° C. | 200° C. |
| Zn—Pc | mobility (cm$^2$/Vs) | $2.3 \times 10^{-4}$ | $2.4 \times 10^{-3}$ | $2.8 \times 10^{-3}$ |
| | conductivity (S/cm) | $1.4 \times 10^{-6}$ | $1.1 \times 10^{-8}$ | $1 \times 10^{-7}$ |
| | on/off ratio | 12 | $2.2 \times 10^4$ | $2 \times 10^3$ |
| $H_2$—Pc | mobility (cm$^2$/Vs) | $1.3 \times 10^{-3}$ | $2.6 \times 10^{-3}$ | $5.6 \times 10^{-7}$ |
| | conductivity (S/cm) | $6.4 \times 10^{-7}$ | $2.2 \times 10^{-9}$ | $2.1 \times 10^{-9}$ |
| | on/off ratio | 160 | $8.1 \times 10^4$ | 26 |
| Sn—Pc | mobility (cm$^2$/Vs) | $7.3 \times 10^{-5}$ | $3.4 \times 10^{-3}$ | not measurable |
| | conductivity (S/cm) | $1.9 \times 10^{-7}$ | $2.4 \times 10^{-8}$ | $4.8 \times 10^{-8}$ |
| | on/off ratio | 36 | $1.6 \times 10^4$ | not measurable |
| Fe—Pc | mobility (cm$^2$/Vs) | $3.6 \times 10^{-5}$ | $6.9 \times 10^{-4}$ | $1.1 \times 10^{-5}$ |
| | conductivity (S/cm) | $5.1 \times 10^{-9}$ | $6.8 \times 10^{-7}$ | $1 \times 10^{-7}$ |
| | on/off ratio | 570 | 110 | 100 |
| Pt—Pc | mobility (cm$^2$/Vs) | $1.5 \times 10^{-4}$ | $1.5 \times 10^{-4}$ | $9 \times 10^{-5}$ |
| | conductivity (S/cm) | $2.2 \times 10^{-7}$ | $2.7 \times 10^{-7}$ | $4.7 \times 10^{-9}$ |
| | on/off ratio | 120 | 80 | $2.6 \times 10^3$ |
| Ni—Pc | mobility (cm$^2$/Vs) | $7 \times 10^{-6}$ | $3 \times 10^{-5}$ | $5.4 \times 10^{-5}$ |
| | conductivity (S/cm) | $3.9 \times 10^{-9}$ | $6.2 \times 10^{-8}$ | $6.4 \times 10^{-9}$ |
| | on/off ratio | 120 | 110 | 110 |

The field-effect mobility reported in Table I was calculated using the following equation:

$$I_{DS} = (WC_i/2L)\mu(V_G - V_O)^2$$

where W is the channel width (250 $\mu$m), L is the channel length (12 $\mu$m) and $C_i$ is the capacitance per unit area of the gate dielectric (10 nF/cm$^2$). To calculate the field effect mobility, $\mu$, using the above-identified equation, the threshold voltage ($V_O$) of the device is determined from the relationship between the square root of the drain-source current ($I_{DS}$) at the saturated region and the gate voltage of the device ($V_G$) by extrapolating from the measured values back to $I_{DS}=0$. The $I_{DS}$ at the saturated region is determined by observing the relationship between the drain-source voltage ($V_{DS}$) and the drain-source current at a given $V_G$. $I_{DS}$ at the saturated region is where $I_{DS}$ no longer increases with increasing drain-source voltage. $I_{DS}$ at the saturated region varies with $V_G$. This method for determining $V_O$ is conventional and well known to one skilled in the art.

The field effect mobilities reported in Table I are average values. Devices were formed using two substrates for every material and every temperature reported in Table I. For example, devices with a Cu-Pc film were formed on six substrates total, two at each of the reported temperatures. At least twenty devices were formed on each substrate.

The on/off ratio is the ratio of the drain current ($I_{D1}$) flowing in saturation when $V_G$ is equal to or greater than the drain voltage ($V_D$) to the $I_{D2}$ flowing when $V_G$ is zero. For example, if $I_{DS}$ is $8 \times 10^{-5}$ A when $V_D$ and $V_G$ are both −100 V and $I_{DS}$ is $1 \times 10^{-11}$ A when $V_G=0$ and $V_D$−100 V, then the on/off ratio of the device is $8 \times 10^6$.

Although the inventor does not wish to be held to a particular theory, it is believed that the performance of the device is linked to the morphology of the phthalocyanine films. X-ray diffraction analysis of the films enumerated in Table I shows an increase in order in most of the films (i.e. the films became less amorphous) with an increase in the temperature of the substrate on which the films Were formed. The order of the films was determined from the x-ray diffraction trace that results from the (200) lattice planes. A trace with a single peak was indicative of a highly ordered film. The intensity of this peak was observed to increase with an increase in the temperature of the substrate on which the film was formed.

Consequently, it appears that the order of the film is related to the field effect mobility of the material. As observed by the data in Table I, the field effect mobility of most films increased as the temperature of the substrate was increased from 30° to 125° C. As noted above, the order of the film also increased with increasing substrate temperature during film formation. However, Table I also shows a decrease in field effect mobility as the substrate temperature during deposition was increased from 125° to 200° C. This effect may be explained by the fact that film discontinuities increase at higher temperatures and these discontinuities have a negative effect on field effect mobility.

Figure 3:
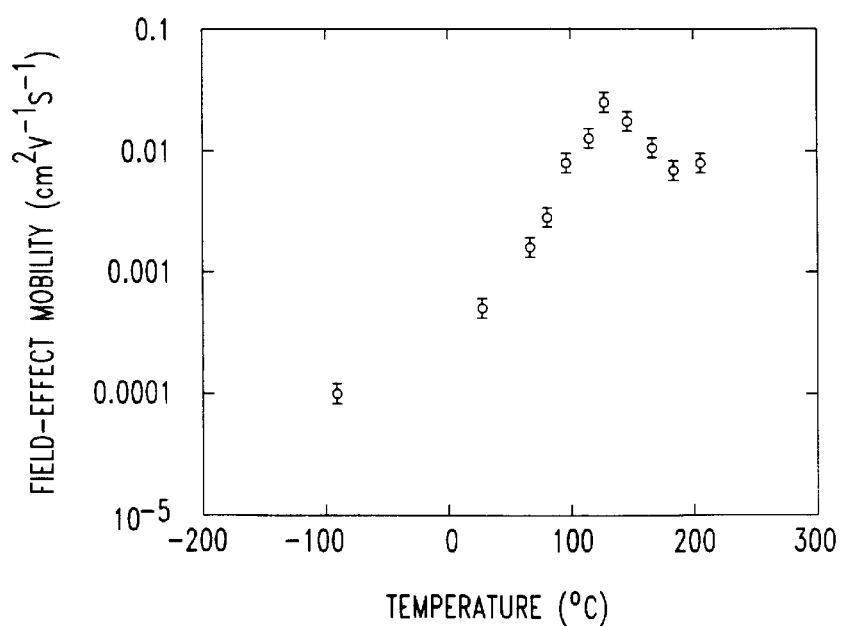
FIG. 3 illustrates the relationship between the field effect mobility of a Cu-Pc film and the temperature of the substrate on which the film is formed.

The relationship between the temperature of the substrate during film formation and the field effect mobility of a Cu-Pc film is illustrated in FIG. 3. FIG. 3 demonstrates that the field effect mobility of the Cu-Pc film increases dramatically as the temperature of the substrate increases from about 30° C. to about 140° C. At substrate temperatures above 140° C., the trend reverses and the field effect mobility decreases with increasing temperature.

What is claimed is:

1. A thin film transistor comprising:
a substrate with a layer of a highly ordered phthalocyanine coordination compound formed thereon, and contacts for applying current through the layer of the phthalocyanine coordination compound wherein the phthalocyanine coordination compound has a field-effect mobility greater than $10^{-3}$ cm$^2$/Vs and a conductivity in the range of about $10^{-9}$ S/cm to about $10^{-7}$ S/cm at 20° C. and wherein the thin film transistor has an on/off ratio of the source drain current that is at least $10^4$.

2. The thin film transistor of claim 1 wherein the phthalocyanine coordination compound has a coordinate selected from the group consisting of copper, zinc, hydrogen, and tin.

3. The thin film transistor of claim 2 wherein the layer of phthalocyanine coordination compound has a thickness of about 500 Å to about 600 Å.

4. The thin film transistor of claim 1 wherein the thin film transistor MIS-FET.

* * * * *